United States Patent
Asano

(10) Patent No.: US 10,270,112 B2
(45) Date of Patent: Apr. 23, 2019

(54) FUEL CELL SYSTEM AND SECONDARY BATTERY DIAGNOSIS METHOD

(71) Applicant: TOYOTA JIDOSHA KABUSHIKI KAISHA, Toyota-shi, Aichi-ken (JP)

(72) Inventor: Masahiro Asano, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 15/834,696

(22) Filed: Dec. 7, 2017

(65) Prior Publication Data

US 2018/0166720 A1    Jun. 14, 2018

(30) Foreign Application Priority Data

Dec. 12, 2016   (JP) .................. 2016-240093

(51) Int. Cl.
   *H01M 8/04*        (2016.01)
   *H01M 8/04992*     (2016.01)
   (Continued)

(52) U.S. Cl.
   CPC ........ *H01M 8/04992* (2013.01); *G01R 31/36* (2013.01); *H01M 8/00* (2013.01); *H01M 8/04* (2013.01); *H01M 8/04082* (2013.01); *H01M 8/04111* (2013.01); *H01M 8/04119* (2013.01); *H01M 8/04179* (2013.01); *H01M 8/04201* (2013.01); *H01M 8/04228* (2016.02); *H01M 8/04303* (2016.02); *H01M 8/04537* (2013.01); *H01M 8/04567* (2013.01); *H01M 8/04597* (2013.01); *H01M 8/04664* (2013.01); *H01M 8/10* (2013.01); *H01M 10/42* (2013.01);
   (Continued)

(58) Field of Classification Search
   CPC ...................................... H01M 8/04
   See application file for complete search history.

(56) References Cited

U.S. PATENT DOCUMENTS

2010/0266911 A1* 10/2010 Aso ................ H01M 8/04179
                                                  429/427
2016/0133963 A1   5/2016 Naganuma et al.

FOREIGN PATENT DOCUMENTS

JP    2007-059067 A    3/2007
JP    2009-231197      10/2009
              (Continued)

*Primary Examiner* — Jacob B Marks
(74) *Attorney, Agent, or Firm* — Finnegan, Henderson, Farabow, Garrett & Dunner, LLP

(57) ABSTRACT

A fuel cell system includes a fuel cell, auxiliary devices, an auxiliary device controller, a secondary battery, a current sensor, a voltage sensor, and a diagnosis controller. In an output stop state where the fuel cell does not output electric power, the auxiliary device controller performs a residual water scavenging process of scavenging water remaining in the fuel cell to outside of the fuel cell system by driving the auxiliary devices using electric power supplied from the secondary battery and supplying the gas to the fuel cell. The diagnosis controller diagnoses the secondary battery using a current integrated value that is obtained by integrating amounts of current supplied from the secondary battery in a predetermined voltage range of a discharge voltage of the secondary battery that changes in response to discharge when electric power is supplied to the auxiliary devices by performing the residual water scavenging process.

8 Claims, 5 Drawing Sheets

(51) Int. Cl.
*G01R 31/36* (2019.01)
*H01M 8/10* (2016.01)
*H01M 10/42* (2006.01)
*H01M 10/44* (2006.01)
*H01M 10/48* (2006.01)
*H01M 8/00* (2016.01)
*H01M 16/00* (2006.01)
*H01M 8/04082* (2016.01)
*H01M 8/04119* (2016.01)
*H01M 8/04537* (2016.01)
*H01M 8/04664* (2016.01)
*H02J 7/00* (2006.01)
*H01M 8/04303* (2016.01)
*H01M 8/04228* (2016.01)
*H02J 7/34* (2006.01)
*H01M 8/04111* (2016.01)
*H02J 1/00* (2006.01)

(52) U.S. Cl.
CPC ........... *H01M 10/44* (2013.01); *H01M 10/48* (2013.01); *H01M 16/00* (2013.01); *H01M 16/006* (2013.01); *H02J 7/00* (2013.01); *H02J 7/34* (2013.01); *H01M 2250/20* (2013.01); *H02J 2001/004* (2013.01); *Y02T 90/32* (2013.01)

(56) References Cited

FOREIGN PATENT DOCUMENTS

| | | |
|---|---|---|
| JP | 2013-150417 | 8/2013 |
| JP | 2014-117008 A | 6/2014 |
| JP | 2016-91885 | 5/2016 |

* cited by examiner

FUEL CELL SYSTEM AND SECONDARY BATTERY DIAGNOSIS METHOD

INCORPORATION BY REFERENCE

The disclosure of Japanese Patent Application No. 2016-240093 filed on Dec. 12, 2016 including the specification, drawings and abstract is incorporated herein by reference in its entirety.

BACKGROUND

1. Technical Field

The present disclosure relates to a fuel cell system including a secondary battery, and a secondary battery diagnosis method.

2. Description of Related Art

In a fuel cell system, a secondary battery may be provided in order to supply electric power to auxiliary devices used for supplying reaction gas, for example, an air compressor or a pump for circulating hydrogen gas. The discharge capacity of a secondary battery gradually deteriorates over time. Therefore, a secondary battery needs to be regularly diagnosed. As a secondary battery diagnosis method, a diagnosis method is proposed (refer to Japanese Unexamined Patent Application Publication No. 2013-150417 (JP 2013-150417 A), the diagnosis method including: obtaining an integrated value of discharge currents in a predetermined voltage range when the discharge voltage of the secondary battery decreases while the secondary battery supplies electric power to auxiliary devices and the like; and diagnosing the degree of capacity deterioration based on the integrated value of discharge currents.

SUMMARY

However, a long period of time, for example, about one hour may be taken to perform a secondary battery diagnosis method of the related art. Therefore, for example, in a configuration in which a fuel cell system is mounted on a vehicle to supply electric power for driving a vehicle, diagnosis may be performed for about one hour after bringing the vehicle to a service shop, which is significantly inconvenient for a user. In addition, even in a fuel cell system that is fixed to land or a building and used, the system may be at a standstill for about one hour for diagnosis, which is inconvenient for a user. Therefore, a technique capable of suppressing deterioration in the convenience of a user relating to diagnosis of a secondary battery included in a fuel cell system is desired.

The disclosure can realize the following aspects.

(1) A first aspect relates to a fuel cell system including: a fuel cell; auxiliary devices used to supply gas to the fuel cell; an auxiliary device controller configured to control an operation of the auxiliary devices; a secondary battery; a current sensor configured to measure an amount of current supplied from the secondary battery; a voltage sensor configured to measure a discharge voltage of the secondary battery; and a diagnosis controller configured to diagnose the secondary battery. The auxiliary device controller is configured to, in an output stop state where the fuel cell does not output electric power, perform a residual water scavenging process of scavenging water remaining in the fuel cell to outside of the fuel cell system by driving the auxiliary devices using electric power supplied from the secondary battery and supplying the gas to the fuel cell. The diagnosis controller is configured to diagnose the secondary battery using a current integrated value that is obtained by integrating amounts of current supplied from the secondary battery in a predetermined voltage range of a discharge voltage of the secondary battery that changes in response to discharge when electric power is supplied to the auxiliary devices by performing the residual water scavenging process.

With the fuel cell system according to the first aspect, the diagnosis controller diagnoses the secondary battery using the current integrated value that is obtained by integrating the amounts of current supplied from the secondary battery in the predetermined voltage range of the discharge voltage of the secondary battery that changes in response to discharge when electric power is supplied to the auxiliary devices by performing the residual water scavenging process in the output stop state. Therefore, the discharge of the secondary battery solely for diagnosing the secondary battery can be avoided. Accordingly, for example, it is unnecessary to bring the fuel cell system to a service shop or to purposely make the fuel cell enter into the output stop state for the diagnosis of the secondary battery, and deterioration in the convenience of a user can be suppressed.

(2) The fuel cell system according to the first aspect may further include a storage unit configured to store an integrated value of amounts of current supplied from the secondary battery. The diagnosis controller may be configured to, when the residual water scavenging process is completed before discharge by the secondary battery in the voltage range is completed, obtain the current integrated value by repeating the following processes (i) and (ii) until the discharge by the secondary battery in the voltage range is completed: (i) a process of causing the storage unit to store an integrated value of amounts of current supplied from the secondary battery, the current is supplied from the start to end of the residual water scavenging process; and (ii) a process of integrating an amount of current supplied from the secondary battery to the integrated value stored in the storage unit when the next residual water scavenging process is performed.

With the fuel cell system according to the first aspect, when the residual water scavenging process is completed before the discharge in the predetermined voltage range is completed, the storage unit stores the integrated value of amounts of current supplied from the secondary battery until the residual water scavenging process is completed from the start of the residual water scavenging process. Next, when the next residual water scavenging process is performed, the amount of current supplied from the secondary battery is integrated to the integrated value stored in the storage unit. The above processes are repeated. Therefore, even when the residual water scavenging process is completed before the discharge in the predetermined voltage range is completed, the integration of the amounts of current supplied from the secondary battery in the predetermined voltage range can be completed by performing the residual water scavenging process once or more. Therefore, a needed current integrated value for the diagnosis of the secondary battery can be obtained, and the secondary battery can be accurately diagnosed.

(3) In the fuel cell system according to the first aspect, the gas may include air as oxidant gas, and the auxiliary devices may include an air compressor. With the fuel cell system according to the first aspect, in general, the current integrated value is obtained during the supply (discharge) of electric power to the air compressor having high power consumption. Therefore, a needed current integrated value for the diagnosis of the secondary battery can be obtained within a short period of time. Further, the secondary battery can be diagnosed while the residual water scavenging process is performed on the cathode side of the fuel cell.

(4) In the fuel cell system according to the first aspect, the gas may include hydrogen gas as fuel gas. The fuel cell system may further include: a tank in which hydrogen gas is stored; an anode gas supply path through which the hydrogen gas is supplied from the tank to the fuel cell; an anode off gas exhaust path through which off gas including the hydrogen gas is exhausted from the fuel cell; a bypass flow path through which the anode off gas exhaust path and the anode gas supply path are connected; and a pump that is disposed in the bypass flow path and supplies off gas exhausted from the anode off gas exhaust path to the anode gas supply path. The auxiliary devices may include the pump. With the fuel cell system according to the first aspect, the secondary battery can be diagnosed while the residual water scavenging process is performed on the anode side of the fuel cell.

(5) In the fuel cell system according to the first aspect, the diagnosis controller may be configured to compare the current integrated value to a threshold integrated value, which is a current integrated value at which deterioration of the secondary battery is at a lower limit of an allowable range, and configured to determine, when the current integrated value is lower than the threshold integrated value, that the secondary battery deteriorates. With the fuel cell system according to the first aspect, the diagnosis controller compares the current integrated value to the threshold integrated value, which is a current integrated value at which the deterioration of the secondary battery is at the lower limit of the allowable range, and determines, when the current integrated value is lower than the threshold integrated value, that the secondary battery deteriorates. Therefore, the diagnosis controller can accurately determine whether or not the secondary battery deteriorates.

(6) In the fuel cell system according to the first aspect, the diagnosis controller may be configured to compare a slope of the current integrated value during a predetermined lapse of time to a threshold slope of a current integrated value, at which deterioration of the secondary battery is at a lower limit of an allowable range, during the predetermined lapse of time and configured to determine, when the slope of the current integrated value is less than the threshold slope, that the secondary battery deteriorates.

(7) In the fuel cell system according to the first aspect, the diagnosis controller may determine whether or not a discharge voltage of the secondary battery at the start of the residual water scavenging process is lower than an upper limit value of the voltage range, may not obtain the current integrated value and may not diagnose the secondary battery when the diagnosis controller determines that the discharge voltage of the secondary battery is lower than the upper limit value of the voltage range, and may obtain the current integrated value and may diagnose the secondary battery when the diagnosis controller determines that the discharge voltage of the secondary battery is not lower than the upper limit value of the voltage range. With the fuel cell system according to the first aspect, when the amounts of current supplied from the secondary battery in the predetermined voltage range cannot be integrated, the diagnosis controller does not obtain the current integrated value and does not diagnose the secondary battery. When the amounts of current supplied from the secondary battery in the predetermined voltage range can be integrated, the diagnosis controller obtains the current integrated value and diagnoses the secondary battery. Therefore, the performing of an unnecessary process can be suppressed, and the secondary battery can be accurately diagnosed.

(8) A second aspect relates to a secondary battery diagnosis method of diagnosing a secondary battery that supplies electric power to auxiliary devices for supplying gas to a fuel cell, the secondary battery diagnosis method including: (a) performing, in an output stop state where the fuel cell does not output electric power, a residual water scavenging process of scavenging water remaining in the fuel cell to outside of the fuel cell system by driving the auxiliary devices using electric power supplied from the secondary battery and supplying the gas to the fuel cell; (b) obtaining a current integrated value by integrating amounts of current supplied from the secondary battery in a predetermined voltage range of a discharge voltage of the secondary battery that changes in response to discharge when electric power is supplied to the auxiliary devices by performing the residual water scavenging process; and (c) diagnosing the secondary battery using the current integrated value.

The aspects can be realized in various forms. For example, the aspects can be realized in various forms such as a secondary battery diagnosis system, a secondary battery diagnosis method, and a method of operating a fuel cell system.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

A. Embodiment

A1. System Configuration

Figure 1:
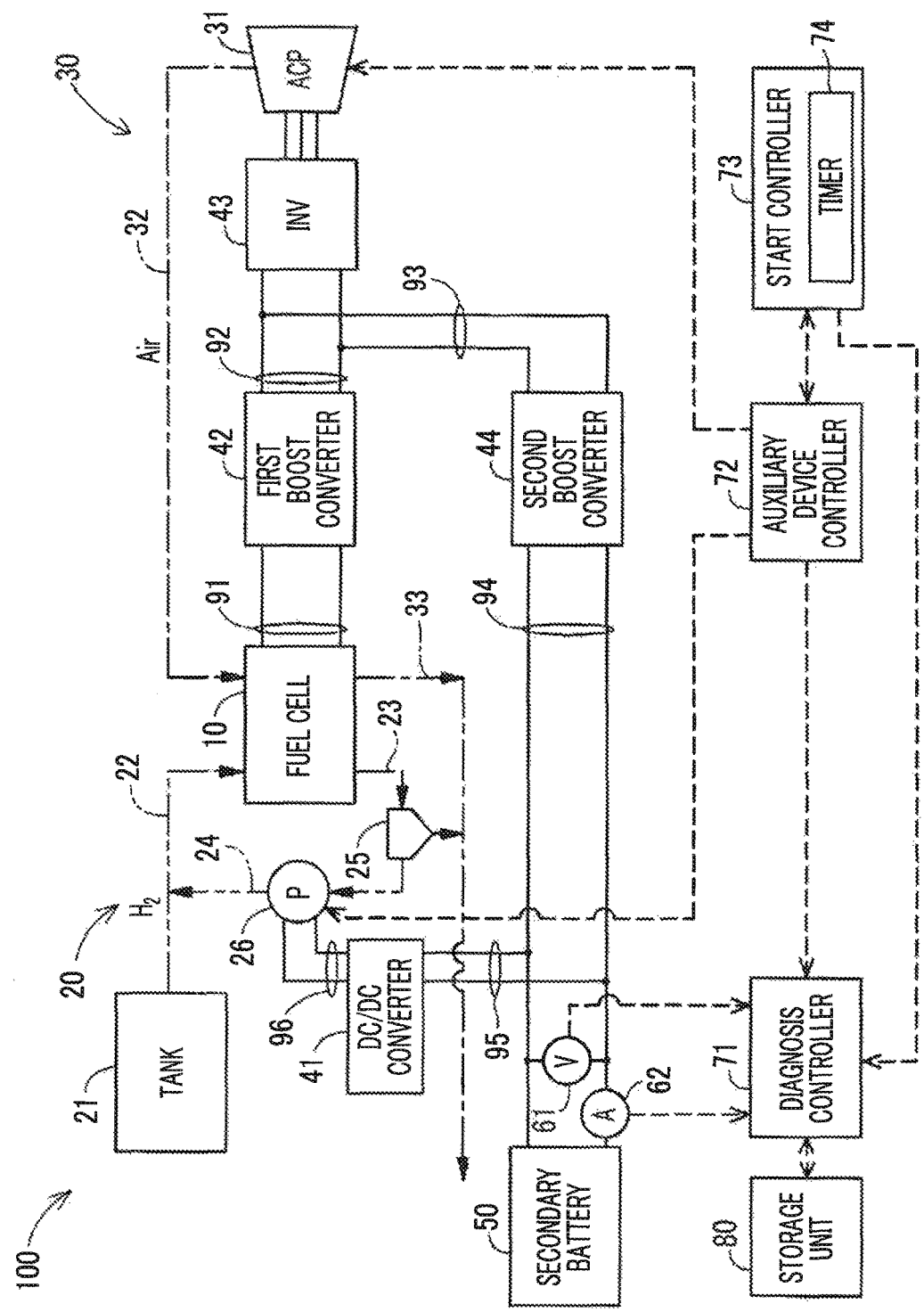
FIG. 1 is a block diagram showing a schematic configuration of a fuel cell system according to an embodiment.

FIG. 1 is a block diagram showing a schematic configuration of a fuel cell system 100 according to an embodiment. The fuel cell system 100 according to the embodiment is mounted on a vehicle to supply electric power to a vehicle drive motor (not shown). The fuel cell system 100 includes a fuel cell 10, an anode-side reaction gas supply-exhaust mechanism 20, a cathode-side reaction gas supply-exhaust mechanism 30, a secondary battery 50, a DC/DC converter 41, a first boost converter 42, an inverter 43, a second boost converter 44, a voltage sensor 61, a current sensor 62, a diagnosis controller 71, an auxiliary device controller 72, a start controller 73, a storage unit 80, a first direct current lead wire 91, a second direct current lead wire 92, a third direct current lead wire 93, a fourth direct current lead wire 94, a fifth direct current lead wire 95, and a sixth direct current lead wire 96.

The fuel cell 10 is a solid polymer fuel cell that generates electric power by the supply of hydrogen gas and air as reaction gas, and has a configuration in which a plurality of single cells is stacked. The fuel cell is not limited to a solid polymer fuel cell, and an arbitrary fuel cell such as a phosphoric acid fuel cell or a solid oxide fuel cell may be used. The fuel cell 10 is connected to an input terminal of the first boost converter 42 through the first direct current lead wire 91.

The anode-side reaction gas supply-exhaust mechanism 20 supplies hydrogen gas as the fuel gas to the fuel cell 10, and exhausts anode off gas from the fuel cell 10. The anode-side reaction gas supply-exhaust mechanism 20 includes a tank 21, an anode gas supply path 22, an anode off gas exhaust path 23, a bypass flow path 24, a gas-liquid separation device 25, and a circulation pump 26.

In the tank 21, hydrogen gas is stored. The tank 21 and the fuel cell 10 are connected through the anode gas supply path 22 such that the hydrogen gas is supplied from the tank 21 to the fuel cell 10. In the anode gas supply path 22, a shut valve (not shown) and an injector (not shown) are provided. The anode off gas exhaust path 23 is connected to an anode off gas exhaust manifold (not shown) provided in the fuel cell 10, and introduces the anode off gas exhausted from the fuel cell 10 to the anode off gas exhaust path 23. A first end of the bypass flow path 24 is connected to the gas-liquid separation device 25, a second end of the bypass flow path 24 is connected to the anode gas supply path 22, and the hydrogen gas exhausted from the gas-liquid separation device 25 is supplied to the anode gas supply path 22 through the bypass flow path 24. The gas-liquid separation device 25 separates water and the hydrogen gas, which are included in the anode off gas supplied through the anode off gas exhaust path 23, from each other and exhausts the hydrogen gas to the bypass flow path 24. The gas-liquid separation device 25 is also connected to a cathode off gas exhaust path described below and supplies the separated water to the cathode off gas exhaust path. The circulation pump 26 is provided in the bypass flow path 24 and supplies the hydrogen gas exhausted from the gas-liquid separation device 25 to the anode gas supply path 22. As a result, a portion of the hydrogen gas, which is supplied to the fuel cell 10 but is not consumed in the fuel cell 10, is supplied again to the fuel cell 10.

The cathode-side reaction gas supply-exhaust mechanism 30 supplies air as the oxidant gas (cathode gas) to the fuel cell 10, and exhausts cathode off gas from the fuel cell 10. The cathode-side reaction gas supply-exhaust mechanism 30 includes an air compressor 31, a cathode gas supply path 32, and a cathode off gas exhaust path 33. The air compressor 31 takes air in from the atmosphere, compresses the air, and supplies the compressed air to the cathode gas supply path 32. The cathode gas supply path 32 is connected a cathode gas supply manifold (not shown) provided in the fuel cell 10, and supplies the air to the fuel cell 10. The cathode off gas exhaust path 33 is connected to a cathode off gas exhaust manifold (not shown) provided in the fuel cell 10, and the cathode off gas exhausted from the fuel cell 10 is exhausted to the outside of the fuel cell system through the cathode off gas exhaust path 33. As described above, the cathode off gas exhaust path 33 is also connected to the gas-liquid separation device 25, and the water exhausted from the gas-liquid separation device 25 to the cathode off gas exhaust path 33 is exhausted to the outside of the fuel cell system through the cathode off gas exhaust path 33 due to the influence of the cathode off gas. In addition, a small amount of the hydrogen gas exhausted from the gas-liquid separation device 25 to the cathode off gas exhaust path 33 is diluted with the cathode off gas and then is exhausted to the outside of the fuel cell system through the cathode off gas exhaust path 33.

In the embodiment, the secondary battery 50 is configured using a lithium ion battery and supplies electric power to auxiliary devices such as the air compressor 31, the circulation pump 26, and a radiator fan (not shown). The discharge capacity of the secondary battery 50 deteriorates over time. Accordingly, in a case where a fixed amount of electric power is supplied, a period of time in which the electric power can be supplied by charging the secondary battery 50 once is reduced over time. In the embodiment, deterioration in the discharge capacity of the secondary battery 50 will be also called "deterioration of the secondary battery 50".

The DC/DC converter 41 is electrically connected to the secondary battery 50 through the fifth direct current lead wire 95, and is also electrically connected to the circulation pump 26 through the sixth direct current lead wire 96. The DC/DC converter 41 converts a voltage input from the secondary battery 50 into a predetermined voltage suitable for the circulation pump 26, and outputs the converted voltage.

The first boost converter 42 is electrically connected to the fuel cell 10 through the first direct current lead wire 91, and is also electrically connected to the inverter 43 through the second direct current lead wire 92. The first boost converter 42 boosts a voltage input from the fuel cell 10 to a target voltage, and outputs the target voltage to the inverter 43. The inverter 43 converts direct current voltages output from the first boost converter 42 and the second boost converter 44 into three-phase alternating current voltages, and supplies the three-phase alternating current voltages to the air compressor 31 and the vehicle drive motor (not shown). In a state (hereinafter, also called "output stop state) where the fuel cell 10 does not output electric power, electric power is supplied from the secondary battery 50 to the air compressor 31. Accordingly, in this case, the inverter 43 converts a direct current voltage output from the second boost converter 44 into a three-phase alternating current voltage, and supplies the three-phase alternating current voltage to the air compressor 31. In a case where the output electric power of the fuel cell 10 is insufficient and lower than a target output power of the vehicle drive motor, the inverter 43 discharges the secondary battery 50 and compensates for the insufficient amount of electric power. The inverter 43 converts regenerative electric power generated from the vehicle drive motor into direct current power, and outputs the direct current power to the second boost converter 44 through the third direct current lead wire 93. The second boost converter 44 is electrically connected to the secondary battery 50 through the fourth direct current lead wire 94, and is also electrically connected to the inverter 43 through the third direct current lead wire 93. The second boost converter 44 boosts a voltage input from the secondary battery 50 to a target voltage, and outputs the target voltage to the inverter 43. The second boost converter 44 drops a voltage of regenerative electric power supplied from the inverter 43 through the third direct current lead wire 93, and outputs the dropped voltage to the secondary battery 50 through the fourth direct current lead wire 94.

The voltage sensor 61 is provided in the fourth direct current lead wire 94 and measures the discharge voltage of the secondary battery 50. Likewise, the current sensor 62 is provided in the fourth direct current lead wire 94 and measures the amount of current supplied from the secondary battery 50. The voltage sensor 61 and the current sensor 62 are electrically connected to the diagnosis controller 71 and notify respective measured values (voltage value and current value) to the diagnosis controller 71.

The diagnosis controller 71 diagnoses the secondary battery 50. More specifically, the diagnosis controller 71 performs a secondary battery diagnosis process described below, and diagnoses whether or not the discharge capacity of the secondary battery 50 deteriorates. The auxiliary device controller 72 is electrically connected to the circulation pump 26 and the air compressor 31, and controls driving and stopping of the circulation pump 26 and the air compressor 31. The auxiliary device controller 72 is electrically connected to the diagnosis controller 71 and the start controller 73. The auxiliary device controller 72 performs a residual water scavenging process during standstill of a vehicle. The start controller 73 includes a timer 74 and performs an auxiliary device start control process. A predetermined time is set in the timer 74, and the time is measured until the predetermined time is expired after starting the timer 74. The time set in the timer 74 may be an arbitrary period of time. As described below, residual water on the anode side and the cathode side is scavenged per the set time. For example, assuming that the residual water scavenging process is performed once at night, eight hours may be set. The diagnosis controller 71, the auxiliary device controller 72, and the start controller 73 are configured using an electronic control unit (ECU) including a microprocessor and a memory, and are driven by electric power supplied from the secondary battery 50. The start controller 73 controls the supply of electric power to the diagnosis controller 71 and the auxiliary device controller 72. The storage unit 80 is electrically connected to the diagnosis controller 71 and may store a current integrated value in a secondary battery diagnosis process described below. The storage unit 80 may be configured as a memory included in the diagnosis controller 71. In the embodiment, the timer 74 is configured using a software timer but may be configured using a hardware timer instead of the software timer.

The fuel cell system 100 may include a cooling medium supply-exhaust mechanism (not shown) in addition to the anode-side reaction gas supply-exhaust mechanism 20 and the cathode-side reaction gas supply-exhaust mechanism 30. The cooling medium supply-exhaust mechanism is a mechanism for adjusting the temperature of the fuel cell 10, supplies a cooling medium such as a coolant to the fuel cell 10, exhausts the cooling medium from the fuel cell 10, and supplies the cooling medium, which has undergone heat exchange with the exhausted cooling medium to the fuel cell 10 again. As the cooling medium supply-exhaust mechanism, for example, a mechanism including a cooling medium supply path and a cooling medium exhaust path that are connected to the fuel cell 10, a radiator, a radiator fan, and a circulation pump may be used.

In the fuel cell system 100 having the above-described configuration, when a vehicle is at a standstill, a shift knob is positioned in parking (P), and a start switch is switched off, the fuel cell 10 enters into the output stop state. In the output stop state, the residual water scavenging process during standstill of a vehicle described below is performed. As a result, water remaining in the fuel cell 10, the flow path of the reaction gas and off gas on the anode side, the flow path of the reaction gas and off gas on the cathode side, and the like is regularly exhausted to the outside of the fuel cell system. This configuration is provided to suppress freezing of water remaining in the fuel cell 10, the respective flow paths, and the like such that gas diffusibility does not deteriorate compared to the usual and such that the opening and closing of various valves (not shown) can be controlled.

In the fuel cell system 100, when the residual water scavenging process is performed during standstill of a vehicle, the secondary battery diagnosis process described below is performed. As a result, deterioration in the convenience of a user relating to the diagnosis of the secondary battery 50 is suppressed.

Here, a relationship of the residual water scavenging process during standstill of a vehicle and the secondary battery diagnosis process described below with the auxiliary device start control process described below will be briefly described. In the residual water scavenging process during standstill of a vehicle, the auxiliary device controller 72 drives the auxiliary devices such as the circulation pump 26 and the air compressor 31 such that the reaction gas is supplied to the fuel cell 10. As a result, the residual water scavenging process of exhausting water remaining in the fuel cell 10 to the outside of the fuel cell system is performed. However, when a vehicle is at a standstill, a shift knob is positioned in parking (P), and a start switch is switched off, the supply of electric power to the auxiliary device controller 72 is stopped. On the other hand, even in a state where the supply of electric power to the auxiliary device controller 72 is stopped, electric power is supplied to the start controller 73. By performing the auxiliary device start control process, the start controller 73 regularly supplies electric power to the auxiliary device controller 72. As a result, the auxiliary device controller 72 can regularly perform the residual water scavenging process during standstill of a vehicle. When a vehicle is at a standstill, a shift knob is positioned in parking (P), and a start switch is switched off, the supply of electric power to the diagnosis controller 71 is stopped as in case of the supply of electric power to the auxiliary device controller 72. However, as in the case of the auxiliary device controller 72, electric power is regularly supplied to the diagnosis controller 71 by the auxiliary device start control process of the start controller 73. As a result, the diagnosis controller 71 can regularly perform the secondary battery diagnosis process.

A2. Residual Water Scavenging Process During Standstill of Vehicle

Figure 2:
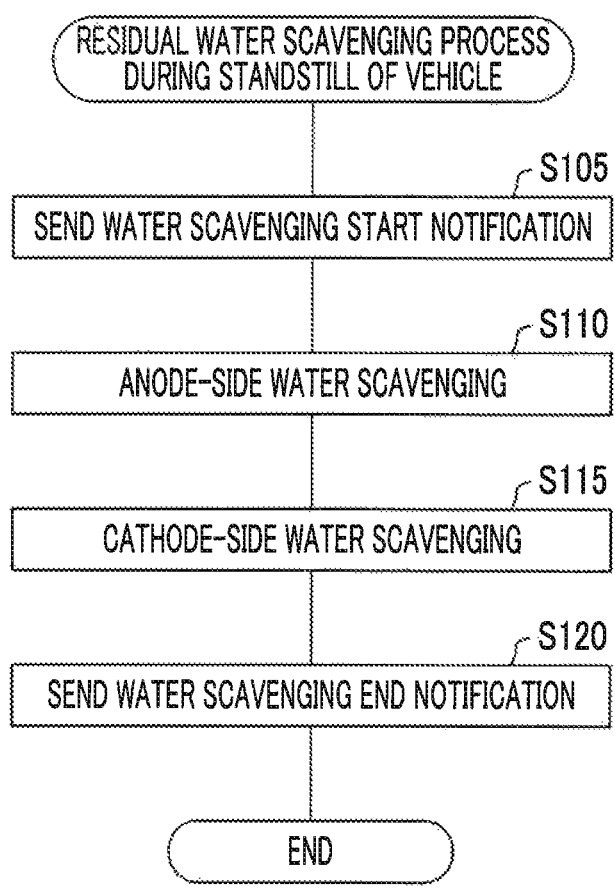
FIG. 2 is a flowchart showing the procedure of a residual water scavenging process during standstill of a vehicle.

FIG. 2 is a flowchart showing the procedure of the residual water scavenging process during standstill of a vehicle. When the supply of electric power to the auxiliary device controller 72 is started as a result of the auxiliary device start control process described below, the residual water scavenging process during standstill of a vehicle is started.

The auxiliary device controller 72 notifies the start of residual water scavenging process to the diagnosis controller 71 (step S105). The auxiliary device controller 72 performs an anode-side residual water scavenging process (step S110). Specifically, the auxiliary device controller 72 opens a purge valve (not shown) provided in the anode off gas exhaust path 23 such that a predetermined amount of hydrogen gas is supplied to the fuel cell 10 per predetermined period of time by the circulation pump 26 and the injector (not shown). As a result, the anode-side water scavenging process is performed. At this time, electric power is supplied from the secondary battery 50 to the circulation pump 26. This way, the hydrogen gas is supplied to the fuel cell 10, and water remaining in the anode side of the fuel cell system 100 is exhausted to the outside of the fuel cell system. "Water remaining in the anode side of the fuel cell system 100" may include: water remaining in pores formed in an anode-side catalyst layer and an anode-side gas diffusion layer of each single cell; water remaining in an anode gas supply manifold and the anode off gas exhaust manifold in the fuel cell 10; water remaining in the anode gas supply path 22; water remaining in the anode off gas exhaust path 23; water remaining in the gas-liquid separation device 25; water remaining in the bypass flow path 24; and water remaining in the circulation pump 26. The water may also include: water (back diffusion water) that passes through an electrolyte membrane from the cathode side of each single cell; and liquid water that is produced by condensation of water vapor included in an atmosphere.

The auxiliary device controller 72 performs a cathode-side residual water scavenging process (step S115). Specifically, the auxiliary device controller 72 drives the air compressor 31 such that a predetermined amount of air is supplied to the fuel cell 10 per predetermined period of time, and adjusts the opening degree of a backpressure valve (not shown) provided in the cathode off gas exhaust path 33 such that the cathode off gas is exhausted from the fuel cell system 100. At this time, electric power is supplied from the secondary battery 50 to the air compressor 31. This way, the air is supplied to the fuel cell 10, and water remaining in the cathode side of the fuel cell system 100 is exhausted to the outside of the fuel cell system. "Water remaining in the cathode side of the fuel cell system 100" may include: water remaining in pores formed in a cathode-side catalyst layer and a cathode-side gas diffusion layer of each single cell; water remaining in the cathode gas supply manifold and the cathode off gas exhaust manifold in the fuel cell 10; water remaining in the cathode gas supply path 32; and water remaining in the cathode off gas exhaust path 33. The water may further include: water that is produced by an electrochemical reaction on the cathode side of each single cell; and liquid water that is produced by condensation of water vapor included in a cathode-side atmosphere.

When the cathode-side water scavenging process (step S115) ends, the auxiliary device controller 72 sends a water scavenging end notification to the diagnosis controller 71 and the start controller 73 (step S120), and the residual water scavenging process during standstill of a vehicle ends.

A3. Auxiliary Device Start Control Process

Figure 3:
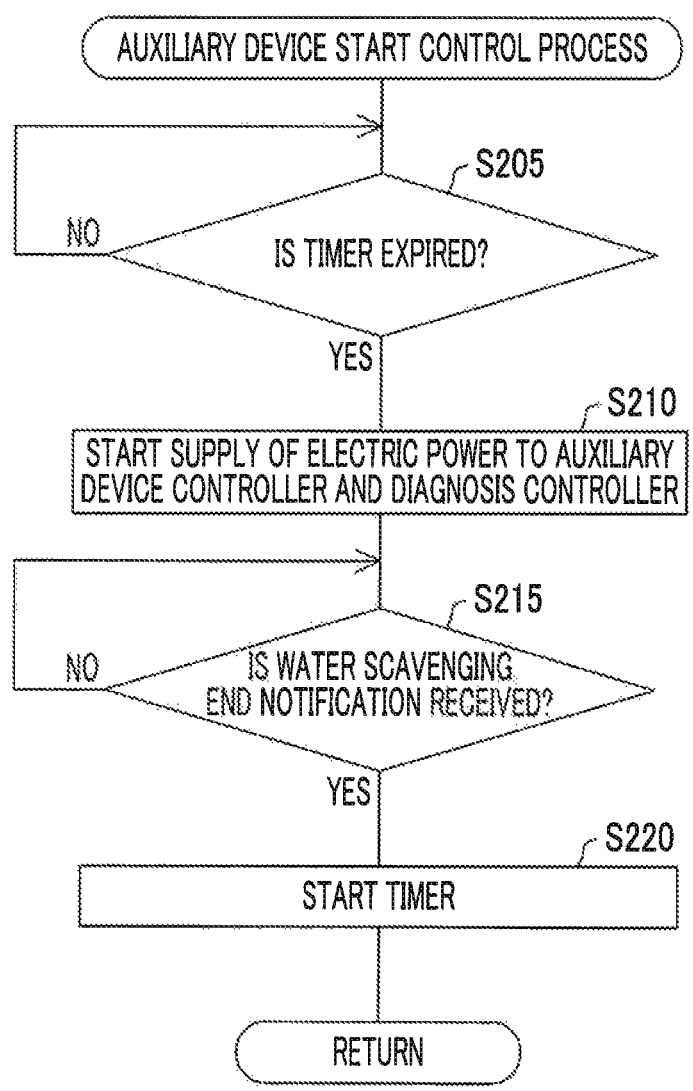
FIG. 3 is a flowchart showing the procedure of an auxiliary device start control process.

FIG. 3 is a flowchart showing the procedure of the auxiliary device start control process. When a vehicle is at a standstill, a shift knob is positioned in parking (P), and a start switch is switched off, the start controller 73 performs the auxiliary device start control process in order to regularly perform the residual water scavenging process during standstill of a vehicle and the secondary battery diagnosis process described below. When a vehicle is at a standstill, a shift knob is positioned in parking (P), and a start switch is switched off, the timer 74 is started.

The start controller 73 waits until the timer 74 is expired (step S205). When the timer 74 is expired (step S205: YES), the start controller 73 starts the supply of electric power to the diagnosis controller 71 and the auxiliary device controller 72 (step S210). Next, the start controller 73 waits until the water scavenging end notification is received from the auxiliary device controller 72 (step S215). When the water scavenging end notification is received (step S215: YES), the start controller 73 is started again (step S220), and the process returns to step S205. Due to the auxiliary device start control process, electric power is supplied to the auxiliary device controller 72 per preset time of the timer 74 such that the residual water scavenging process during standstill of a vehicle is performed. In addition, electric power is supplied to the diagnosis controller 71 per preset time of the timer 74 such that the secondary battery diagnosis process described below is performed.

A4. Secondary Battery Diagnosis Process

The diagnosis controller 71 performs the secondary battery diagnosis process in response to the supply of electric power to the diagnosis controller 71 during standstill of a vehicle (output stop state). First, a method of diagnosing the secondary battery 50 will be briefly described. When the secondary battery 50 is discharged, the discharge voltage gradually deteriorates. At this time, current values supplied from the secondary battery 50 in a predetermined discharge voltage range (hereinafter, simply called "predetermined voltage range") are integrated, and the diagnosis controller 71 diagnoses whether or not the discharge capacity of the secondary battery deteriorates using the integrated value of the current values (hereinafter, also called "current integrated value"). In a case where the discharge capacity deteriorates over time, the current integrated value in the predetermined voltage range decreases. Therefore, in a case where the obtained current integrated value is lower than a threshold integrated value, the diagnosis controller 71 determines that the secondary battery 50 deteriorates. Here, in the embodiment, the upper limit value of the predetermined voltage range is set as a voltage value in a state of so-called full charge. The lower limit value of the predetermined voltage range is set as a voltage value at which, even in a case where a start switch of a vehicle is switched on in a state where the voltage value decreased to the lower limit, a needed electric power can be supplied to the auxiliary devices and the vehicle can travel.

Figure 4:
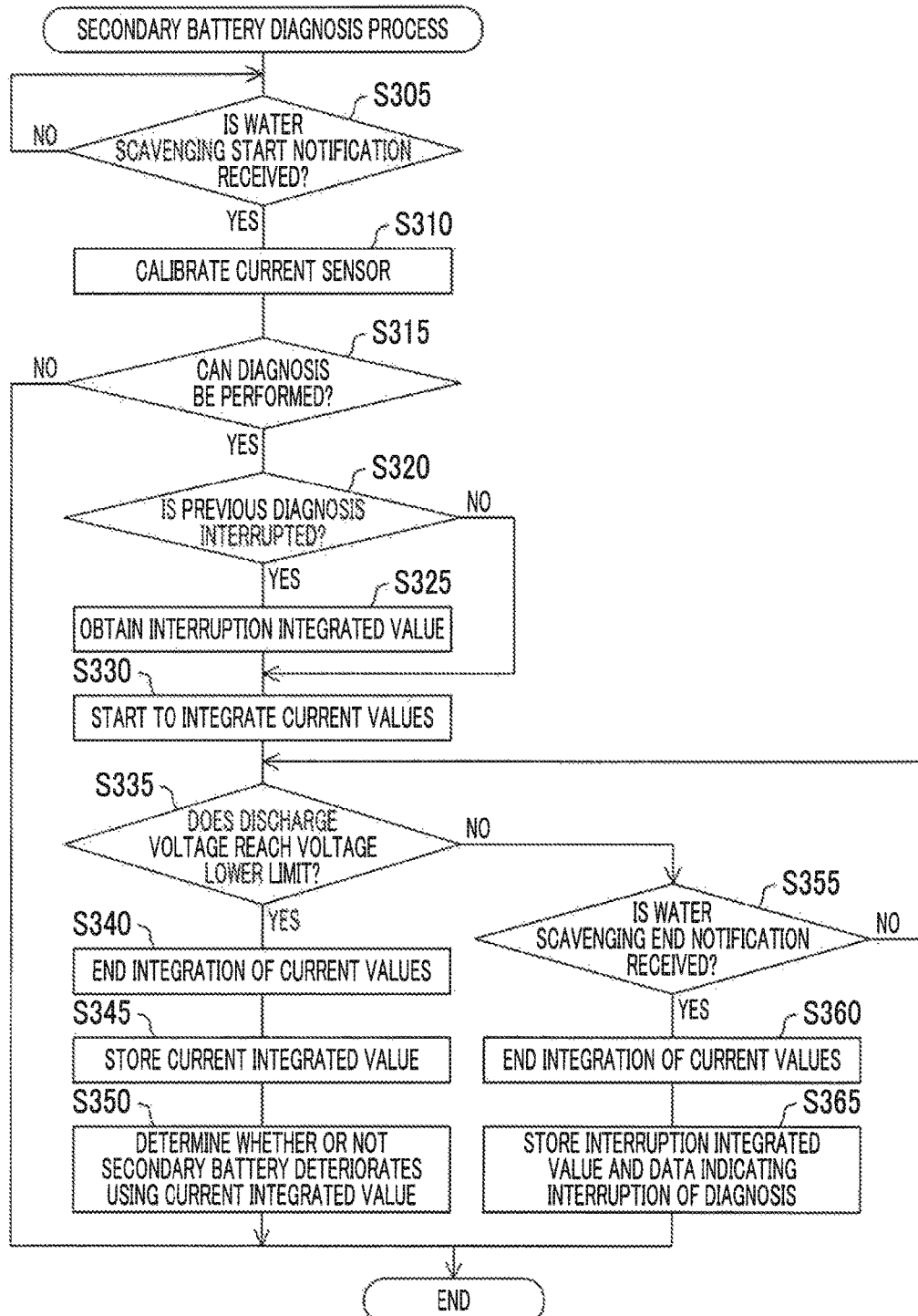
FIG. 4 is a flowchart showing the procedure of a secondary battery diagnosis process.

FIG. 4 is a flowchart showing the procedure of the secondary battery diagnosis process. When the secondary battery diagnosis process is started, first, the diagnosis controller 71 waits until a water scavenging start notification is received from the auxiliary device controller 72 (step S305). When the water scavenging start notification is received (step S305: YES), the diagnosis controller 71 performs calibration of the current sensor 62 (step S310). Specifically, the diagnosis controller 71 measures a current value multiple times in a state where a current does not flow through the fourth direct current lead wire 94, and performs a process (so-called zero-point adjustment) of shifting the zero point by the average value of the measured current values. The calibration of the current sensor 62 is performed between step S105 and step S110 shown in FIG. 2.

The diagnosis controller 71 determines whether or not the diagnosis can be performed (step S315). As described above, in order to diagnosis the secondary battery 50, the current integrated value in the predetermined voltage range is obtained. Therefore, in a case where the discharge voltage of the secondary battery 50 is lower than the upper limit value of the predetermined voltage range in the first place, the current integrated value of the predetermined voltage range cannot be obtained. Accordingly, in a case where the measured value of the voltage sensor 61, that is, the discharge voltage of the secondary battery 50 is lower than the upper limit value of the predetermined voltage range, the diagnosis controller 71 determines that the diagnosis cannot be performed (step S315: NO), and the secondary battery diagnosis process ends. At this time, the secondary battery diagnosis process may end after information regarding "the state where the diagnosis cannot be performed" is stored in the storage unit 80 as a history. On the other hand, in a case where the discharge voltage of the secondary battery 50 is the upper limit value of the predetermined voltage range or higher, the diagnosis controller 71 determines that the diagnosis can be performed (step S315: YES), and then determines whether or not the previous diagnosis is interrupted (step S320).

In the residual water scavenging process during standstill of a vehicle, the discharge voltage of the secondary battery 50 decreases along with the supply of electric power to the air compressor 31, the circulation pump 26, and the like. However, in a case where the residual water scavenging process during standstill of a vehicle is completed until the discharge voltage reaches the lower limit of the predetermined voltage range, the supply of electric power to the air compressor 31 and the circulation pump 26 is stopped, and thus the current integrated value does not reach the lower limit of the predetermined voltage range. In this case, the secondary battery diagnosis process is interrupted as described below, and data indicating the interruption is stored in the storage unit 80. Therefore, in step S320, the diagnosis controller 71 determines whether or not the previous diagnosis is interrupted by checking whether or not the data indicating the interruption is stored in the storage unit 80.

In a case where the diagnosis controller 71 determines that the previous diagnosis is not interrupted (step S320: NO), the diagnosis controller 71 starts to integrate current values measured by the current sensor 62 (step S330). The diagnosis controller 71 determines whether or not the discharge voltage of the secondary battery 50 reaches the lower limit value of the predetermined voltage range (step S335). In a case where the diagnosis controller 71 determines that the discharge voltage of the secondary battery 50 reaches the lower limit value of the predetermined voltage range (step S335: YES), the diagnosis controller 71 ends the integration of the current values (step S340) and stores the current integrated value in the storage unit 80 (step S345). In the residual water scavenging process during standstill of a vehicle, predetermined auxiliary devices are driven for a predetermined time. In step S340, the discharge voltage of the secondary battery 50 reaches the lower limit value of the predetermined voltage range before the auxiliary devices are stopped. The diagnosis controller 71 determines whether or not the discharge capacity of the secondary battery 50 deteriorates using the current integrated value stored in the storage unit 80 (step S350), and the secondary battery diagnosis process ends. The details of the determination regarding the deterioration in step S350 will be described using FIG. 5.

Figure 5:
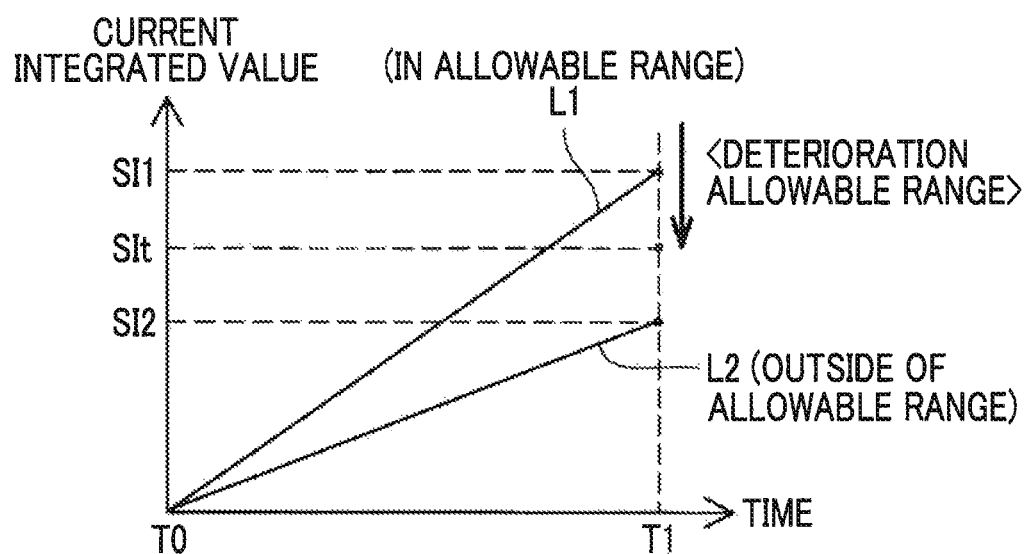
FIG. 5 is a diagram showing a change of a current integrated value after starting to integrate current values.

FIG. 5 is a diagram showing a change of the current integrated value after starting to integrate the current values. In FIG. 5, the horizontal axis represents the elapsed time from the start of the current value integration, and the vertical axis represents the current integrated value. In addition, in FIG. 5, straight line L1 represents a change of the current integrated value in a case where deterioration in the discharge capacity of the secondary battery 50 is an allowable range, and straight line L2 represents a change of the current integrated value in a case where deterioration in the discharge capacity of the secondary battery 50 is lower than the allowable range. FIG. 5 shows a change of the current integrated value that starts at time T0 and ends at time T1. The power consumptions of the auxiliary devices in the residual water scavenging process during standstill of a vehicle are constant. Therefore, the decrease rate of the discharge voltage is substantially constant. Therefore, the change (decrease) in discharge voltage and the lapse of time are substantially proportional to each other. The allowable range of the deterioration of the discharge capacity of the secondary battery 50 represents a range of the deterioration of the discharge capacity where there is no problem in the operation of the fuel cell system 100, and can be experimentally obtained.

Irrespective of whether or not the discharge capacity of the secondary battery 50 deteriorates, the current integrated value increases over time. However, in a case where the deterioration is lower than the allowable range, the current integrated value shown in straight line L2 is lower than that shown in straight line L1 at the same time. Accordingly, a current integrated value SI2 at which the deterioration at time T1 is lower than the allowable range is lower than a current integrated value SI1 at which the deterioration at time T1 is in the allowable range. In the embodiment, a current integrated value corresponding to the lower limit of the allowable range of the deterioration of the secondary battery 50 is obtained in advance from an experiment or the like and set as a threshold integrated value SIt. In step S350, in a case where the current integrated value obtained in step S330 to S340 is lower than the threshold integrated value SIt, the diagnosis controller 71 determines that the discharge capacity of the secondary battery 50 deteriorates. In a case where the current integrated value obtained in step S330 to S340 is the threshold integrated value SIt or higher, the diagnosis controller 71 determines that the discharge capacity of the secondary battery 50 does not deteriorate.

In step S335, in a case where the diagnosis controller 71 determines that the discharge voltage of the secondary battery 50 does not reach the lower limit value of the predetermined voltage range (step S335: NO), as shown in FIG. 4, the diagnosis controller 71 determines whether or not the water scavenging end notification is received from the auxiliary device controller 72 (step S355). In a case where the diagnosis controller 71 determines that the water scavenging end notification is not received (step S355: NO), the process returns to step S335.

On the other hand, in a case where the diagnosis controller 71 determines that the water scavenging end notification is received (step S355: YES), the diagnosis controller 71 finishes the integration of the current values (step S360) and stores the current integrated value and data indicating that the diagnosis is interrupted in the storage unit 80 (step S365), and the secondary battery diagnosis process ends. The current integrated value stored in the storage unit 80 in step S365 is an integrated value of the discharge currents in a case where the discharge voltage changes in a voltage range narrower than the predetermined voltage range. In the embodiment, the current integrated value stored in the storage unit 80 in step S365 will be called an interruption integrated value.

In a case where the secondary battery diagnosis process ends after step S365 is performed, whether or not the discharge capacity of the secondary battery 50 deteriorates is not determined. The reason for this is as follows. The residual water scavenging process during standstill of a vehicle ends before the discharge voltage of the secondary battery 50 reaches the lower limit of the predetermined voltage range, and the secondary battery 50 is not further discharged. Therefore, a needed value for the diagnosis cannot be obtained as the current integrated value. However, in the embodiment, in a case where the next residual water scavenging process during standstill of a vehicle is started and the next secondary battery diagnosis process is also started accordingly, the diagnosis controller 71 determines that the previous diagnosis is interrupted in step S320 (step S320: YES). In this case, the diagnosis controller 71 acquires the interruption integrated value from the storage unit 80 (step S325), and then the process starts from step S330. In a case where step S325 is performed, the diagnosis controller 71 integrates the measured current value to the interruption integrated value. For example, it is assumed that: in the output stop state, the first residual water scavenging process during standstill of a vehicle is performed and ends before the discharge voltage reaches the lower limit value of the predetermined voltage range; and then the second residual water scavenging process during standstill of a vehicle is performed after a predetermined period of time elapses in the output stop state. In this case, the secondary battery 50 is not charged after the end of the first residual water scavenging process during standstill of a vehicle. Therefore, the discharge voltage of the secondary battery 50 at the start of the second residual water scavenging process during standstill of a vehicle is substantially the same as the discharge voltage of the secondary battery 50 at the end of the first residual water scavenging process during standstill of a vehicle. Accordingly, in a case where the current value is integrated to the interruption integrated value such that the discharge voltage of the secondary battery 50 reaches the lower limit value of the predetermined voltage range, the integrated value of the discharge current is obtained while the discharge voltage of the secondary battery 50 decreases from the upper limit value to the lower limit value of the predetermined voltage range. Accordingly, the diagnosis controller 71 can accurately determine whether or not the discharge capacity of the secondary battery 50 deteriorates using the integrated value of the discharge currents.

In step S315 in which the next secondary battery diagnosis process is performed after the interruption of the diagnosis, the diagnosis controller 71 verifies that the data indicating the interruption of the diagnosis is stored in the storage unit 80, and then the diagnosis controller 71 determines that the diagnosis can be performed even in a case where the discharge voltage of the secondary battery 50 is lower than the upper limit value of the predetermined voltage range.

The result of the secondary battery diagnosis process, that is, whether or not the secondary battery 50 deteriorates may be used, for example, as follows. By lighting or blinking a predetermined LED lamp or the like included in an instrument panel of a vehicle, the diagnosis controller 71 may notify the deterioration of the secondary battery 50 to a user. In addition, the diagnosis controller 71 notifies the deterioration of the secondary battery 50 to a user using a sound of a speaker. In addition, the content to be notified is not limited to the data indicating the deterioration of the secondary battery 50, and may be data that urges a user to bring a vehicle to a service shop or data that urges a user to stop a vehicle.

With the fuel cell system 100 according to the embodiment, the diagnosis controller 71 diagnoses the secondary battery 50 using the current integrated value that is obtained by integrating the amounts of current supplied from the secondary battery 50 in the predetermined voltage range of the discharge voltage of the secondary battery 50 that changes in response to discharge when electric power is supplied to the auxiliary devices (for example, the circulation pump 26 and the air compressor 31) by performing the residual water scavenging process in the output stop state. Therefore, the discharge of the secondary battery 50 solely for diagnosing the secondary battery 50 can be avoided. Accordingly, for example, it is unnecessary to bring a vehicle (the fuel cell system 100) to a service shop or to purposely make the fuel cell 10 enter into the output stop state for the diagnosis of the secondary battery, and deterioration in the convenience of a user can be suppressed.

In a case where the residual water scavenging process during standstill of a vehicle is completed before the discharge in the predetermined voltage range is completed, the interruption integrated value from the start to end of the residual water scavenging process during standstill of a vehicle is stored in the storage unit 80. Next, when the next residual water scavenging process during standstill of a vehicle is performed, the amount of current supplied from the secondary battery 50 is integrated to the interruption integrated value stored in the storage unit 80. Accordingly, even in a case where the residual water scavenging process during standstill of a vehicle is completed before the discharge in the predetermined voltage range is completed, the integration of the amounts of current supplied from the secondary battery 50 in the predetermined voltage range can be completed by performing the residual water scavenging process once or more. Therefore, a needed current integrated value for the diagnosis of the secondary battery 50 can be obtained, and the secondary battery 50 can be accurately diagnosed.

In general, the current integrated value is obtained during the supply (discharge) of electric power to the air compressor 31 having high power consumption. Therefore, a needed current integrated value for the diagnosis of the secondary battery 50 can be obtained within a short period of time. The diagnosis controller 71 compares the current integrated value to the threshold integrated value SIt, which is a current integrated value at which the deterioration of the secondary battery 50 is at the lower limit of the allowable range, and determines, in a case where the current integrated value is lower than the threshold integrated value SIt, that the secondary battery 50 deteriorates. Therefore, the diagnosis controller 71 can accurately determine whether or not the secondary battery 50 deteriorates.

In addition, in a case where the discharge voltage of the secondary battery 50 is lower than the upper limit value of the predetermined voltage range at the start of the integration of the current values, that is, in a case where the amounts of current supplied from the secondary battery 50 in the predetermined voltage range cannot be integrated, the diagnosis controller 71 does not obtain the current integrated value and does not diagnose the secondary battery 50. In a case where the amounts of current supplied from the secondary battery 50 in the predetermined voltage range can be integrated, the diagnosis controller 71 obtains the current integrated value and diagnoses the secondary battery 50. Therefore, the performing of an unnecessary process can be suppressed, and the secondary battery 50 can be accurately diagnosed.

B. Modification Examples

B1. Modification Example 1

In the embodiment, the cathode-side water scavenging process is performed after the anode-side water scavenging process in the residual water scavenging process during standstill of a vehicle. However, the order of performing the water scavenging processes may be reversed. In the residual water scavenging process during standstill of a vehicle, the residual water scavenging process is performed on both the anode side and the cathode side. However, the water scavenging process may be performed on either the anode side or the cathode side. For example, in a configuration where the residual water scavenging process is performed solely on the cathode side, the secondary battery 50 can be diagnosed while the residual water scavenging process is performed on the cathode side of the fuel cell 10. In a configuration where the residual water scavenging process is performed solely on the anode side, the secondary battery 50 can be diagnosed while the residual water scavenging process is performed on the anode side of the fuel cell 10. Accordingly, the same effects as those of the embodiment can be exhibited. For example, in a case where the residual water scavenging process is performed when a start switch is switched off, the residual water scavenging process during standstill of a vehicle may be performed solely on the anode side. In a case where the water scavenging process is not performed when a start switch is switched off, the residual water scavenging process during standstill of a vehicle may be performed on either the anode side or the cathode side.

B2. Modification Example 2

In the embodiment, the residual water scavenging process during standstill of a vehicle is regularly performed in the output stop state, but the disclosure is not limited thereto. For example, the temperature of the fuel cell 10 or the outside air temperature may be regularly measured such that, in a case where the measured temperature is lower than a predetermined temperature, for example, a temperature in a predetermined temperature range centering on 0° C., the residual water scavenging process during standstill of a vehicle is performed. In addition, for example, in a case where the average lowest temperature in a predetermined period (for example, three days) immediately before the residual water scavenging process is 0° C. or lower, the residual water scavenging process during standstill of a vehicle may be performed.

B3. Modification Example 3

However, in the embodiment, in a case where the residual water scavenging process during standstill of a vehicle ends before the discharge voltage of the secondary battery 50 reaches the lower limit value of the predetermined voltage range, the current value is integrated to the previous interruption integrated value in the next secondary battery diagnosis process. However, the disclosure is not limited to this configuration. For example, in a case where the diagnosis is interrupted, the interruption integrated value may not be stored in the storage unit 80, and in a case where the second or subsequent secondary battery diagnosis process is performed, the diagnosis (the integration of the current values) may not be performed until the discharge voltage of the secondary battery 50 becomes the upper limit value of the predetermined voltage range or higher. Even in the configuration, in a case where the fuel cell system 100 is started subsequently to charge the secondary battery 50, the discharge voltage may be higher than the upper limit value of the predetermined voltage range. Accordingly, in a case where the fuel cell 10 enters into the output stop state subsequently, the current integrated value can be accurately obtained in the secondary battery diagnosis process.

B4. Modification Example 4

In the embodiment, the diagnosis controller 71 compares the current integrated value to the threshold integrated value SIt and determines, in a case where the current integrated value is lower than the threshold integrated value SIt, that the secondary battery 50 deteriorates. However, the disclosure is not limited to this configuration. For example, the diagnosis controller 71 may obtain a slope of the straight line shown in FIG. 5 and, in a case where the slope is less than a predetermined value, may determine that the secondary battery 50 deteriorates. For example, a current integrated value of current values at two times may be stored during the integration of the current values such that the slope of the straight line can be obtained based on the current integrated value. In addition, the degree of deterioration may be specified instead of determining whether or not the secondary battery 50 deteriorates. In the configuration, the specifying of the degree of deterioration corresponds to the diagnosis of the secondary battery 50.

B5. Modification Example 5

In the embodiment, in a case where the discharge voltage of the secondary battery 50 is lower than the upper limit value of the predetermined voltage range, the diagnosis controller 71 determines that the diagnosis cannot be performed (step S315: NO), and the secondary battery diagnosis process ends. However, the disclosure is not limited to this configuration. For example, the current values may be integrated constantly without performing step S315. By setting a voltage range in which the upper limit value is relatively low as the predetermined voltage range, the discharge voltage of the secondary battery 50 at the start of the integration of the current values becomes more likely to be higher than the upper limit value of the predetermined voltage range. Accordingly, in this case, step S315 may not be performed. In the configuration of the embodiment, the predetermined voltage range can be set as a wide voltage range, and a current integrated value having higher reliability can be obtained in order to diagnose whether or not the secondary battery 50 deteriorates.

B6. Modification Example 6

In step S315 of the embodiment, in a case where the discharge voltage of the secondary battery 50 is lower than the upper limit value of the predetermined voltage range, the diagnosis controller 71 determines that the diagnosis cannot be performed. However, the disclosure is not limited to this configuration. For example, not only in a case where the discharge voltage of the secondary battery 50 is lower than the upper limit value of the predetermined voltage range but also in a case where a shift knob of a vehicle is positioned in a mode other than parking such as drive (D) or reverse (R) that is a mode corresponding to a state where the fuel cell system 100 is switched on, the diagnosis controller 71 may determine that the diagnosis cannot be performed.

B7. Modification Example 7

In the embodiment, the gas used in the residual water scavenging process during standstill of a vehicle is the reaction gas (hydrogen gas and air). However, another gas may be used instead of or in addition to the reaction gas. For example, the residual water scavenging process may be provided using specific gas for the residual water scavenging process by supplying the specific gas to the fuel cell 10 and providing a function for exhausting off gas. As the specific gas, for example, nitrogen gas may be used:

B8. Modification Example 8

In the embodiment, some of configurations realized by hardware may be realized by software. Conversely, some of configurations realized by software may be realized by hardware. In addition, in a case where some or all of the functions of the disclosure are realized by software, the software (computer program) may be provided in the form of a computer-readable recording medium storing the software. "Computer-readable recording medium" includes not only portable recording media such as a flexible disk and a CD-ROM but also internal storage devices within computers such as a RAM and a ROM and external storage devices fixed to computers such as a hard disk. That is, "computer-readable recording medium" has a broad meaning including arbitrary recording media that can fix data not temporarily.

The disclosure is not limited to the above-described embodiments and the modification examples, and various configurations can be realized. For example, the technical features in the embodiments and the modification examples corresponding to the technical features in the respective aspects described in "SUMMARY" can be appropriately replaced or combined with each other. Moreover, unless specified as indispensable features in this specification, the technical features can be appropriately removed.

What is claimed is:

1. A fuel cell system comprising:
a fuel cell;
auxiliary devices used to supply gas to the fuel cell;
an auxiliary device controller configured to control an operation of the auxiliary devices;
a secondary battery;
a current sensor configured to measure an amount of current supplied from the secondary battery;
a voltage sensor configured to measure a discharge voltage of the secondary battery; and
a diagnosis controller configured to diagnose the secondary battery, wherein:
the auxiliary device controller is configured to, in an output stop state where the fuel cell does not output electric power, perform a residual water scavenging process of scavenging water remaining in the fuel cell to outside of the fuel cell system by driving the auxiliary devices using electric power supplied from the secondary battery and supplying the gas to the fuel cell; and
the diagnosis controller is configured to diagnose the secondary battery using a current integrated value that is obtained by integrating amounts of current supplied from the secondary battery in a predetermined voltage range of the discharge voltage of the secondary battery that changes in response to discharge when electric power is supplied to the auxiliary devices by performing the residual water scavenging process.

2. The fuel cell system according to claim 1, further comprising a storage unit configured to store an integrated value of amounts of current supplied from the secondary battery,
wherein the diagnosis controller is configured to, when the residual water scavenging process is completed before discharge by the secondary battery in the voltage range is completed, obtain the current integrated value by repeating following processes (i) and (ii) until the discharge by the secondary battery in the voltage range is completed:
(i) a process of causing the storage unit to store the integrated value of amounts of current supplied from the secondary battery, the current being supplied from start to end of the residual water scavenging process; and
(ii) a process of integrating the amount of current supplied from the secondary battery to the integrated value stored in the storage unit when the next residual water scavenging process is performed.

3. The fuel cell system according to claim 1, wherein:
the gas includes air as oxidant gas; and
the auxiliary devices include an air compressor.

4. The fuel cell system according to claim 1, wherein:
the gas includes hydrogen gas as fuel gas;
the fuel cell system further comprises
a tank in which hydrogen gas is stored,
an anode gas supply path through which the hydrogen gas is supplied from the tank to the fuel cell,
an anode off gas exhaust path through which off gas including the hydrogen gas is exhausted from the fuel cell,
a bypass flow path through which the anode off gas exhaust path and the anode gas supply path are connected, and
a pump that is disposed in the bypass flow path and supplies off gas exhausted from the anode off gas exhaust path to the anode gas supply path; and
the auxiliary devices include the pump.

5. The fuel cell system according to claim 1, wherein the diagnosis controller is configured to compare the current integrated value to a threshold integrated value, which corresponds to a lower limit current integrated value at which deterioration of the secondary battery is at a lower limit of an allowable range, and configured to determine, when the current integrated value is lower than the threshold integrated value, that the secondary battery deteriorates.

6. The fuel cell system according to claim 1, wherein the diagnosis controller is configured to compare a slope of the current integrated value during a predetermined lapse of time to a threshold slope of a lower limit current integrated value, at which deterioration of the secondary battery is at a lower limit of an allowable range, during the predetermined lapse of time and configured to determine, when the slope of the current integrated value is less than the threshold slope, that the secondary battery deteriorates.

7. The fuel cell system according to claim 1, wherein the diagnosis controller determines whether or not the discharge voltage of the secondary battery at a start of the residual water scavenging process is lower than an upper limit value of the voltage range, does not obtain the current integrated value and does not diagnose the secondary battery when the diagnosis controller determines that the discharge voltage of the secondary battery is lower than the upper limit value of the voltage range, and obtains the current integrated value and diagnoses the secondary battery when the diagnosis controller determines that the discharge voltage of the secondary battery is not lower than the upper limit value of the voltage range.

8. A secondary battery diagnosis method of diagnosing a secondary battery that supplies electric power to auxiliary devices for supplying gas to a fuel cell, the secondary battery diagnosis method comprising:
(a) performing, in an output stop state where the fuel cell does not output electric power, a residual water scavenging process of scavenging water remaining in the fuel cell to outside of the fuel cell by driving the auxiliary devices using electric power supplied from the secondary battery and supplying the gas to the fuel cell;
(b) obtaining a current integrated value by integrating amounts of current supplied from the secondary battery in a predetermined voltage range of a discharge voltage of the secondary battery that changes in response to discharge when electric power is supplied to the auxiliary devices by performing the residual water scavenging process; and (c) diagnosing the secondary battery using the current integrated value.

* * * * *